(12) United States Patent
Lee et al.

(10) Patent No.: US 7,892,922 B2
(45) Date of Patent: Feb. 22, 2011

(54) MOLECULAR ELECTRONIC DEVICE INCLUDING PLURALITY OF MOLECULAR ACTIVE LAYERS AND METHOD OF MANUFACTURING THE MOLECULAR ELECTRONIC DEVICE

(75) Inventors: Hyoyoung Lee, Daejeon (KR); Wongi Hong, Daejeon (KR); Joowon Lee, Seoul (KR); Jihye Kim, Pyeongtaek-si (KR); Mihee Jeong, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 201 days.

(21) Appl. No.: 12/365,882

(22) Filed: Feb. 4, 2009

(65) Prior Publication Data
US 2010/0019230 A1    Jan. 28, 2010

(30) Foreign Application Priority Data
Jul. 25, 2008    (KR) ...................... 10-2008-0072940

(51) Int. Cl.
*H01L 21/8238*    (2006.01)
*H01L 29/788*    (2006.01)
(52) U.S. Cl. ....................................... 438/261; 257/316
(58) Field of Classification Search .................. 438/201, 438/211, 260–266; 257/315–322
See application file for complete search history.

(56) References Cited

FOREIGN PATENT DOCUMENTS

| JP | 2005-228804 A | | 8/2005 |
|---|---|---|---|
| KR | 1020080044740 | * | 3/2007 |
| KR | 1020080022024 A | | 3/2008 |
| KR | 1020080044740 A | | 5/2008 |

OTHER PUBLICATIONS

Guoqian Jiang et al., "Nanopatterning and Fabrication of Memory Devices from Layer-by Layer Poly(3,4-ethylenedioxythiophene)-Poly(styrene sulfonate) Ultrathin Films," Langmuir, 2007, pp. 817-825, vol. 23, No. 2.

* cited by examiner

*Primary Examiner*—Calvin Lee

(57) ABSTRACT

Provided are a molecular electronic device including a functional molecular active layer having a stack structure including oppositely charged first and second molecular active layers, and a method of manufacturing the molecular electronic device. The molecular electronic device includes: a first electrode; an organic dielectric thin layer comprising molecules each having a first end self-assembled on a surface of the first electrode and a second end having a cationic or anionic group; a functional molecular active layer stacked on the organic dielectric thin layer by selective self-assembly with positive and negative ions and comprising an electroactive functional group having a cyclic compound; and a second electrode formed on the functional molecular active layer.

22 Claims, 6 Drawing Sheets

MOLECULAR ELECTRONIC DEVICE INCLUDING PLURALITY OF MOLECULAR ACTIVE LAYERS AND METHOD OF MANUFACTURING THE MOLECULAR ELECTRONIC DEVICE

CROSS-REFERENCE TO RELATED PATENT APPLICATION

This application claims the benefit of Korean Patent Application No. 10-2008-0072940, filed on Jul. 25, 2008, in the Korean Intellectual Property Office, the disclosure of which is incorporated herein in its entirety by reference.

BACKGROUND OF THE INVENTION

1. Field of the Invention

The present invention relates to a molecular electronic device and a method of manufacturing the same, and more particularly, to a molecular electronic device including a molecular active layer having a functional group that can provide electrical characteristics to the molecular active layer.

2. Description of the Related Art

As it has become known that organic materials have semiconductor characteristics due to the presence of conjugated pi ($\pi$) electrons, much research into organic semiconductor devices has been conducted. Also, molecular switching devices or memory devices using functional molecules capable of providing electrical characteristics have been actively developed. In particular, as commercially available nano-sized semiconductor devices which can be manufactured on the scale of several tens of nanometers are being competitively developed, the development of more highly integrated and further miniaturized molecular electronic devices is increasingly in demand.

Recently, a technique for forming a functional molecular active layer as a single molecular layer on an underlying metal electrode by using self-assembly has been proposed. According to this technique, the functional molecular active layer formed as a single molecular layer may be as thin as several nanometers. The density of the functional molecular active layer may be relatively low. Thus, when an electrode material for forming an electrode is deposited on the functional molecular active layer, the electrode material may permeate the functional molecular active layer, thereby causing a short circuit in a molecular electronic device including the functional molecular active layer and making it difficult for the molecular electronic device to be used practically.

SUMMARY OF THE INVENTION

The present invention provides a highly integrated molecular electronic device having a size on the scale of several to several tens of nanometers which uses the electrical characteristics of a functional molecular active layer to prevent short circuits and damage to the functional molecular active layer due to permeation of an electrode material and thus to effectively exhibit desired electrical characteristics.

The present invention also provides a method of manufacturing a highly integrated molecular electronic device having a size on the scale of several to several tens of nanometers which can prevent short circuits and damage to a functional molecular active layer due to permeation of an electrode material and thus can improve the yield and reliability of the molecular electronic device.

According to an aspect of the present invention, there is provided a molecular electronic device comprising: a first electrode; an organic dielectric thin layer comprising molecules each having a first end self-assembled on a surface of the first electrode and a second end having a cationic or anionic group; a functional molecular active layer stacked on the organic dielectric thin layer by selective self-assembly with positive and negative ions and comprising an electroactive functional group having a cyclic compound; and a second electrode formed on the functional molecular active layer.

The organic dielectric thin layer may be a molecular layer formed by selectively binding a compound comprising a thiol derivative or a silane derivative as an anchoring group onto the surface of the first electrode by self-assembly. the organic dielectric thin layer is a single molecular layer. The organic dielectric thin layer may comprise molecules having a structure selected from the group of structures represented by

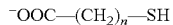  <Formula 1> where n is an integer of 1 to 20, and

  <Formula 2> where n is an integer of 1 to 20.

The functional molecular active layer may comprise a first molecular active layer and a second molecular active layer, wherein the first molecular active layer and the second molecular active layer are oppositely charged to each other. The functional molecular active layer may comprise: a first molecular active layer having a first charge opposite to a charge of the second end of each of the molecules of the organic dielectric thin layer and stacked on the second end of each of the molecules of the organic dielectric thin layer by selective self-assembly with positive and negative ions; and a second molecular active layer having a second charge opposite to the first charge of the first molecular active layer and stacked on the first molecular active layer by selective self-assembly with positive and negative ions. The second end of each of the molecules of the organic dielectric thin layer may have a cationic group, the first molecular active layer comprises an anionic molecule, and the second molecular active layer comprises a cationic molecule. The second end of each of the molecules of the organic dielectric thin layer may have an anionic group, the first molecular active layer comprises a cationic molecule, and the second molecular active layer comprises an anionic molecule.

The functional molecular active layer may have a multilayer structure in which a plurality of first molecular active layers each having a first charge and a plurality of second molecular active layers each having a second charge that is opposite to the first charge are alternately stacked.

Each of the first electrode and the second electrode may be formed on an insulating layer. The molecular electronic device may further comprise a hydrophobic thin layer formed between the insulating layer and the second electrode. The hydrophobic thin layer may be a single molecular layer self-assembled on a surface of the insulating layer.

According to another aspect of the present invention, there is provided a method of manufacturing a molecular electronic device, the method comprising: forming a first electrode on a first region of a top surface of an insulating layer that is formed on a substrate; forming a hydrophobic thin layer on a second region of the top surface which is not covered by the first electrode; forming an organic dielectric thin layer on a surface of the first electrode by contacting molecules each having a first end with an anchoring group and a second end with a cationic or anionic group with the surface of the first electrode; forming on the organic dielectric thin layer a functional molecular active layer that is stacked with positive and negative ions by using a selective self-assembly process and which comprises an electroactive functional group having a cyclic compound; and forming a second electrode on the functional molecular active layer.

The forming of the functional molecular active layer may comprise: (a) forming a first molecular active layer having a first charge, which is opposite to a charge of a surface of the organic dielectric thin layer, on the surface of the organic dielectric thin layer by selective self-assembly with positive and negative ions; and (b) forming a second molecular active layer having a second charge, which is opposite to the first charge, on a surface of the first molecular active layer by selective self-assembly with positive and negative ions.

The method may further comprise (c) forming a first molecular active layer having the first charge on a surface of the second molecular active layer by selective self-assembly with positive and negative ions, after operation (b). The method may further comprise repeatedly performing operation (b) and operation (c) several times, after operation (c).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
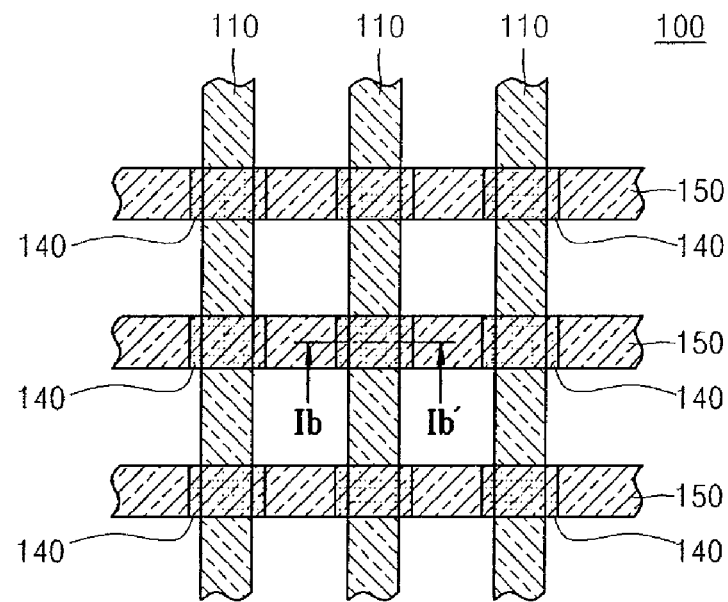
FIG. 1A is a layout illustrating a part of a molecular electronic device according to an embodiment of the present invention.

The present invention will now be described more fully with reference to the accompanying drawings, in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those of ordinary skill in the art. In the accompanying drawings, the thickness and width of layer(s) or region(s) are exaggerated for the sake of clarity. The same reference numerals refer to the same constitutional elements throughout the specification.

Figure 1B:
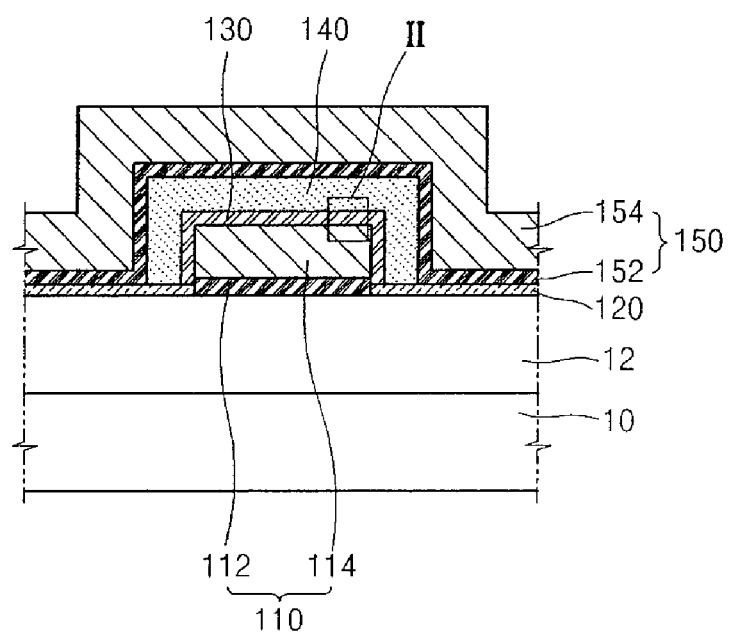
FIG. 1B is a cross-sectional view taken along a line Ib-Ib' of FIG. 1A.

FIG. 1A is a layout illustrating a part of a molecular electronic device 100 according to an embodiment of the present invention. Referring to FIG. 1A, the molecular electronic device 100 according to the present embodiment includes first electrodes 110 and second electrodes 150 arranged in a 3×3 array. FIG. 1B is a cross-sectional view taken along a line Ib-Ib' of FIG. 1A.

Referring to FIGS. 1A and 1B, the first electrodes 110 and the second electrodes 150 are formed on an insulating layer 12 that is disposed on a substrate 10. The first electrodes 110 and the second electrodes 150 are formed on the insulating layer 12 to perpendicularly intersect each other at predetermined positions of the insulating layer 12. The substrate 10 may be a silicon substrate, and the insulating layer 12 may be a silicon oxide layer, a silicon nitride layer, or a composite layer of silicon oxide and silicon nitride.

Portions other than portions of a top surface of the insulating layer 12 on which the first electrodes 110 are formed are covered by a hydrophobic thin layer 120. The hydrophobic thin layer 120 may be a single molecular layer self-assembled on the top surface of the insulating layer 12. For example, the hydrophobic thin layer 120 may be a single molecular layer formed by self-assembling $C_1$-$C_{20}$ alkyltrichlorosilane on the top surface of the insulating layer 12.

Each of the first electrodes 110 may include a metal. For example, each of the first electrodes 110 may include a first barrier layer 112 and a first metal layer 114 as illustrated in FIG. 1B. The first barrier layer 112 may be formed of titanium (Ti). The first barrier layer 112 may be omitted if necessary. The first metal layer 114 may be formed of gold, platinum, silver, or chromium.

Each of the second electrodes 150 may include a second barrier layer 152 and a second metal layer 154 that is stacked on the second barrier layer 152 as illustrated in FIG. 1B. The second barrier layer 152 prevents metal atoms deposited thereon from diffusing into layers below the second barrier layer 152. The second barrier layer 152 may be formed of Ti. The second barrier layer 152 may be omitted if necessary. The second metal layer 154 may be formed of gold, platinum, silver, or chromium.

An organic dielectric thin layer 130 and a functional molecular active layer 140 are sequentially stacked on the first electrode 110.

The organic dielectric thin layer 130 may include molecules each having a first end self-assembled on a surface of the first electrode 110 and a second end having a cationic or anionic group.

The organic dielectric thin layer 130 may be a molecular layer formed by selectively binding a compound including a thiol derivative or a silane derivative as an anchoring group onto the surface of the first electrode 110 by self-assembly. The organic dielectric thin layer 130 may be a single molecular layer, or a multi-layer structure including a plurality of molecular layers.

The first end of each of the molecules of the organic dielectric thin layer 130 may include a thiol derivative or a silane derivative and may be selectively self-assembled on an insulating layer such as a silicon oxide layer or a metal electrode. The second end of each of the molecules of the organic dielectric thin layer 130 may include a cationic group, such as —$NH_3^+$, or an anionic group, such as —$COO^-$, and may accordingly exhibit cationic or anionic surface characteristics.

Compounds that may be used to form the organic dielectric thin layer 130 are represented by Formulae 1 and 2 below:

$$^-OOC-(CH_2)_n-SH \qquad \text{<Formula 1>}$$

where n is an integer of 1 to 20, and $$H_3N^+-(CH_2)_n-SH \qquad \text{<Formula 2>}$$

where n is an integer of 1 to 20.

In the compounds represented by Formulae 1 and 2, a thiol derivative or a silane derivative serves as a specific alligator clip that can be self-assembled on the first electrode 110. That is, in the molecular electronic device 100 of FIGS. 1A and 1B, the organic dielectric thin layer 130 may be a single molecular layer that is selectively bound to the surface of the first electrode 110 by self-assembly by using the thiol derivative or the silane derivative as an anchoring group. The thickness of the organic dielectric thin layer 130 may be adjusted by adjusting the length of an alkyl chain in a compound constituting a molecular layer of the organic dielectric thin layer 130, in other words, by adjusting the value n in —($CH_2$)n- in each of Formulae 1 and 2.

The functional molecular active layer 140 may have a multi-layer structure in which a plurality of oppositely charged single molecular layers are alternately stacked on the organic dielectric thin layer 130 by selective self-assembly with positive and negative ions. Each of the single molecular layers constituting the functional molecular active layer 140 may include an electroactive functional group having a cyclic compound.

Figure 2A:
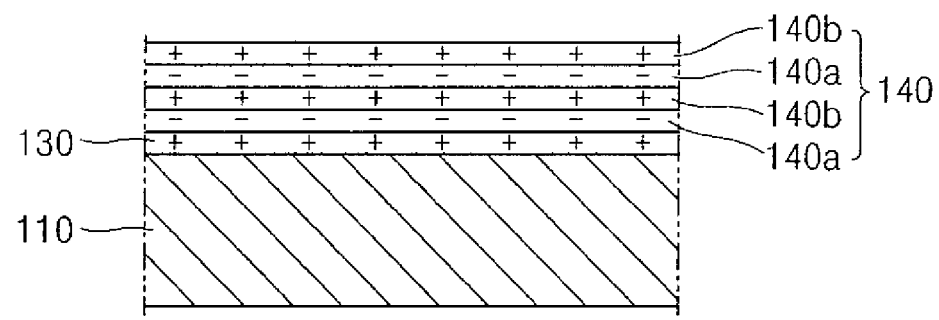
FIG. 2A is a cross-sectional view of a portion II of FIG. 1B, illustrating an organic dielectric thin layer and a functional molecular active layer of the molecular electronic device of FIGS. 1A and 1B, according to an embodiment of the present invention.
Figure 2B:
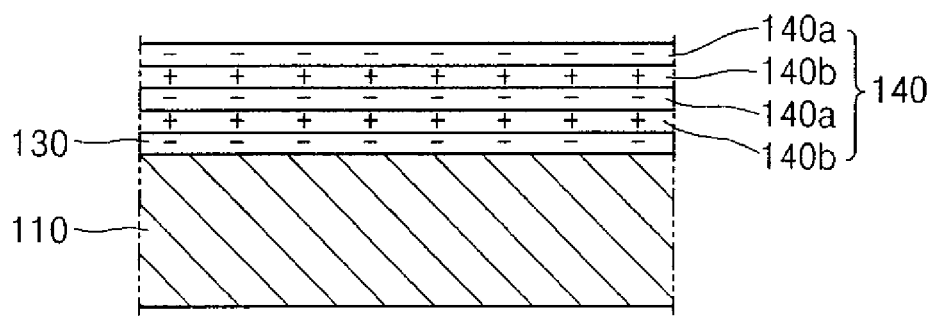
FIG. 2B is a cross-sectional view of the portion II of FIG. 1B, illustrating an organic dielectric thin layer and a functional molecular active layer of the molecular electronic device of FIGS. 1A and 1B, according to another embodiment of the present invention.

FIGS. 2A and 2B are cross-sectional views of a portion 11 of FIG. 1B, illustrating the organic dielectric thin layer 130 and the functional molecular active layer 140 of the molecular electronic device 100 of FIGS. 1A and 1B, according to embodiments of the present invention.

In FIGS. 2A and 2B, the functional molecular active layer 140 having a multi-layer structure is formed by alternately stacking first molecular active layers 140a and second molecular active layers 140b, which are oppositely charged, on the organic dielectric thin layer 130 by selective self-assembly with positive and negative ions.

In FIG. 2A, the second end of each of the molecules of the organic dielectric thin layer 130 formed on the first electrode 110 includes a cationic group, and thus the organic dielectric thin layer 130 has cationic surface characteristics.

Referring to FIG. 2A, each of the first molecular active layers 140a includes anionic molecules that are opposite to the cationic surface characteristics of the organic dielectric thin layer 130. The first molecular active layer 140a is stacked on the organic dielectric thin layer 130 by selective self-assembly with the cationic second end of each of the molecules of the organic dielectric thin layer 130 and the anionic molecules of the first molecular active layer 140a. Also, each of the second molecular active layers 140b including cationic molecules that are opposite to the anionic molecule of the first molecular active layer 140a is stacked on the first molecular active layer 140a by selective self-assembly with the anionic molecule of the first molecular active layer 140a and the cationic molecules of the second molecular active layer 140b. The functional molecular active layer 140 having a multi-layer structure is obtained by alternately stacking a plurality of first molecular active layers 140a and a plurality of second molecular active layers 140b on the organic dielectric thin layer 130 in the same manner as described above.

In FIG. 2B, the second end of each of the molecules of the organic dielectric thin layer 130 formed on the first electrode 110 includes an anionic group, and thus the organic dielectric thin layer 130 has anionic surface characteristics.

Referring to FIG. 2B, each of the second molecular active layers 140b includes cationic molecules that are opposite to the anionic surface characteristics of the organic dielectric thin layer 130. The second molecular active layer 140b is stacked on the organic dielectric thin layer 130 by selective self-assembly with the anionic second end of each of the molecules of the organic dielectric thin layer 130 and the cationic molecules of the second molecular active layer 140b. Also, each of the first molecular active layers 140a including anionic molecules that are opposite to the cationic molecules of the second molecular active layer 140a is stacked on the second molecular active layer 140b by selective self-assembly with the cationic molecules of the second molecular active layer 140b and the anionic molecules of the first molecular active layer 140a. The functional molecular active layer 140 having a multi-layer structure is obtained by alternately stacking a plurality of second molecular active layers 140b and a plurality of first molecular active layers 140a on the organic dielectric thin layer 130 in the same manner as described above.

In FIGS. 2A and 2B, the number of the first molecular active layers 140a and the number of the second molecular active layers 140b stacked on the organic dielectric thin layer 130 may be determined according to a desired thickness of the functional molecular active layer 140. For example, the functional molecular active layer 140 may include 1 to 50 first molecular active layers 140a and 1 to 50 second molecular active layers 140b.

Each of the first molecular active layers 140a and the second molecular active layers 140b constituting the functional molecular active layer 140 may be formed of a material selected from the group consisting of poly(3,4-ethylenedioxythiophene) doped with poly(4-styrenesulonate) (PEDOT/PSS), Rose Bengal, metal-terpyridine complex, metal-bipyridine complex, porphyrin, ferrocene, and amino methanofullerene.

If the first molecular active layers 140a include anionic molecules, the plurality of first molecular active layers 140a constituting the functional molecular active layer 140 may not necessarily have the same structure. The plurality of first molecular active layers 140a constituting the functional molecular active layer 140 may be obtained from a variety of anionic single molecular layers having different structures. Also, if the second molecular active layers 140b include cationic molecules, the plurality of second molecular active layers 140b constituting the functional molecular active layer 140 may not necessarily have the same structure. The plurality of second molecular active layers 140a constituting the functional molecular active layer 140 may be obtained from a variety of cationic single molecular layers having different structures.

Anionic molecules that may be used to form the functional molecular active layer 140 of the molecular electronic device 100 are represented by Formula 3 (PEDOT:PSS), Formula 4 (Rose Bengal), and Formula 5 (metal-terpyridine complex) below.

<Formula 3>

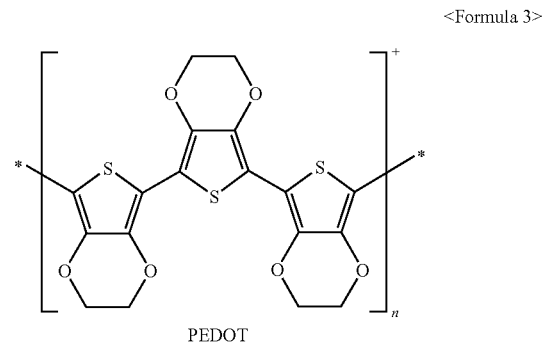

PEDOT

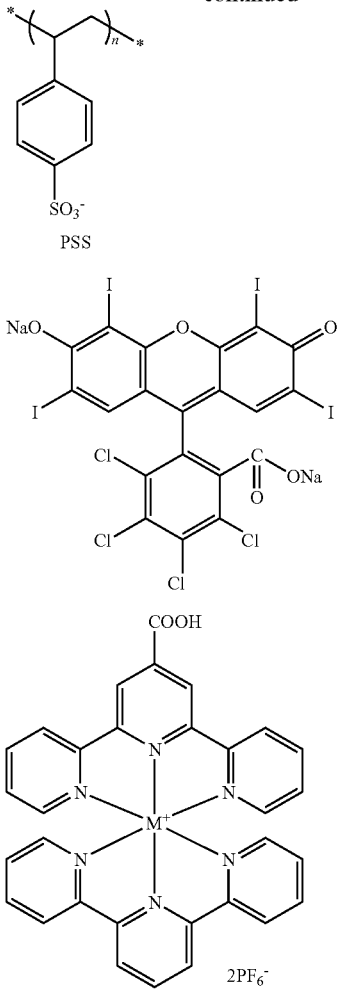

<Formula 4>

<Formula 5>

In Formula 5, M⁺ is cobalt, nickel, iron, or ruthenium.

Other anionic molecules that may be used to form the functional molecular active layer 140 of the molecular electronic device 100 may include metal-bipyridine, porphyrin, and ferrocene.

Amino methanofullerene, which is a cationic molecule that may be used to form the functional molecular active layer 140 of the molecular electronic device 100, is represented by Formula 6.

<Formula 6>

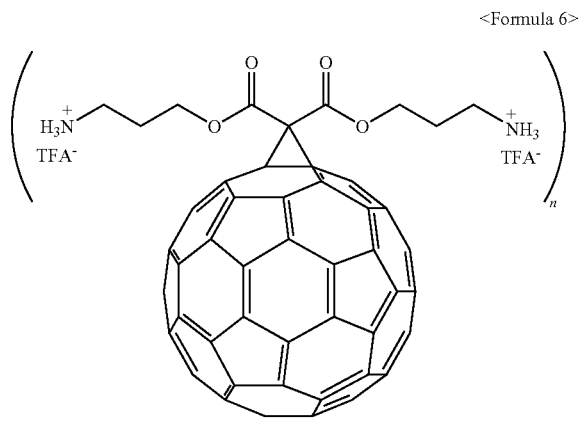

In Formula 6, n is 1, 3, or 6.

Other cationic molecules that may be used to form the functional molecular active layer 140 of the molecular electronic device 100 may include porphyrin and ferrocene. A cationic group, such as —$NH_3^+$, or an anionic group, such as —$COO^-$ may be bonded to each of porphyrin and ferrocene. Accordingly, each molecule may serve as an anionic molecule or a cationic molecule depending on whether an anionic group or a cationic group is bonded thereto.

The molecular electronic device 100 of FIGS. 1A and 1B may be used as a switching device that can be switched between an "on" state and an "off" state according to a voltage applied between the first electrodes 110 and the second electrodes 150. Alternatively, the molecular electronic device 100 of FIGS. 1A and 1B may be used a memory device that stores a predetermined electrical signal according to a voltage applied between the first electrodes 110 and the second electrodes 150. That is, the molecular electronic device 100 of FIGS. 1A and 1B can provide both memory characteristics and switching characteristics.

FIGS. 3A through 3E are cross-sectional views illustrating a method of manufacturing the molecular electronic device 100 of FIGS. 1A and 1B, according to an embodiment of the present invention. The same elements in FIGS. 3A through 3E as those in FIGS. 1A and 1B are denoted by the same reference numerals, and thus a detailed explanation thereof will not be given.

Figure 3A:
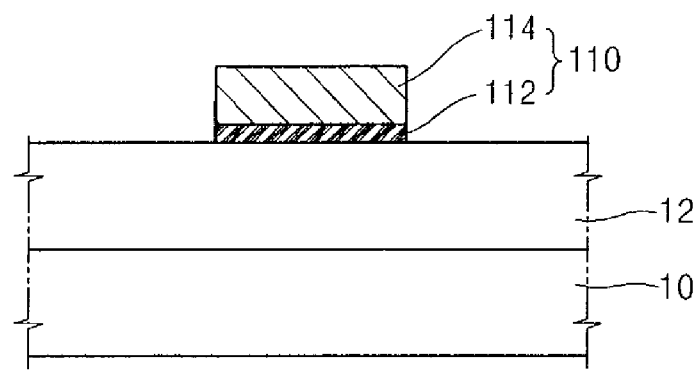
FIGS. 3A through 3E are cross-sectional views illustrating a method of manufacturing the molecular electronic device of FIGS. 1A and 1B, according to an embodiment of the present invention.

Referring to FIG. 3A, the insulating layer 12 is formed on the substrate 10, and the first electrode 110 is formed on the insulating layer 12.

The substrate 10 may be a silicon substrate, a glass substrate, a quartz substrate, or a flexible polymer substrate.

The insulating layer 12 may be a silicon oxide layer, a silicon nitride layer, or a composite layer of silicon oxide and silicon nitride. The insulating layer 12 may be omitted if necessary.

The first electrode 110 may be formed by forming a mask pattern made of a photoresist material, such as poly(methyl methacrylate) (PMMA), on a portion of a top surface of the insulating layer 12 by nanoimprinting or photolithography, forming a conductive layer for the first electrode 110 including the first barrier layer 112 and the first metal layer 114 on a portion of the top surface of the insulating layer 12 which is not covered by the mask pattern and on the mask pattern by E-beam deposition, and removing the mask pattern by nanoimprinting. Alternatively, the first electrode 110 may be formed by conventional photolithography or E-beam lithography.

Figure 3B:
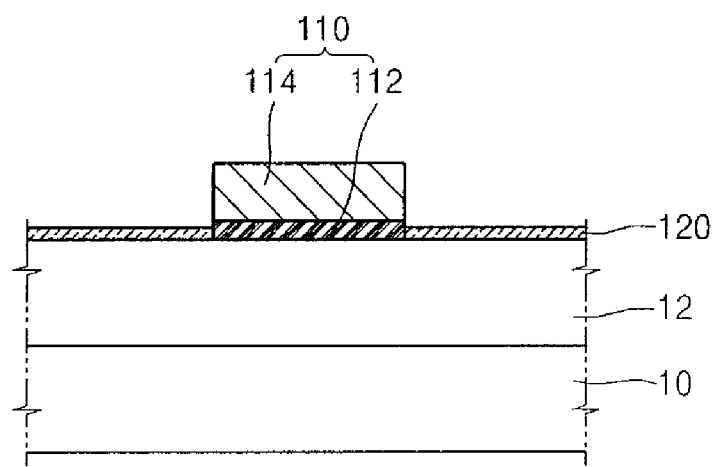

Referring to FIG. 3B, the hydrophobic thin layer 120 is formed on a portion of the top surface of the insulating layer 12 which is not covered by the first electrode 110.

The hydrophobic thin layer 120 is formed such that a self-assembled thin layer is not formed on a surface of the insulating layer 12 but is formed only on a surface of the first electrode 110 in a subsequent process.

The hydrophobic thin layer 120 may be formed by self-assembling a nonpolar molecule, such as $C_1$-$C_{20}$ alkyltrichlorosilane, on the surface of the insulating layer 12. To this end, a resultant structure including the first electrode 112 may be dipped for a predetermined period of time in an organic solution in which a nonpolar molecule, such as octadecyltrichlorosilane, is dissolved.

The hydrophobic thin layer 120 formed on the surface of the insulating layer 12 prevents a functional molecular active layer from being formed on the hydrophobic thin layer 120, thereby avoiding cross-talk and horizontal current leakage between the plurality of first electrodes 110 (see FIG. 1A) formed on the substrate 10.

Figure 3C:
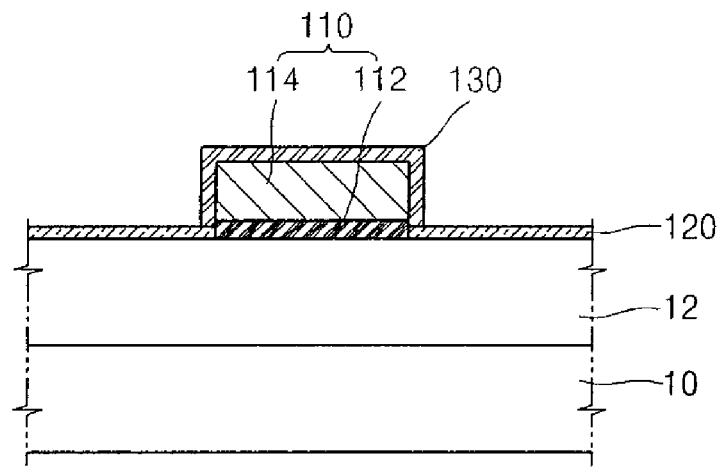

Referring to FIG. 3C, the organic dielectric thin layer 130 is formed on the surface of the first electrode 110 by contacting molecules each having a first end with an anchoring group and a second end with a cationic or anionic group with the surface of the first electrode 110.

The first end of each of the molecules of the organic dielectric thin layer 130 may include a thiol derivative or a silane derivative as an anchoring group that can be self-assembled on a surface of a metal, and the second end of each of the molecules of the organic dielectric thin layer 130 may include a cationic group, such as $NH_3^+$, or an anionic group, such as $-COO^-$. The molecule structured as described above is selectively self-assembled only on the surface of the first electrode 110 using the thiol or silane derivative of the first end as the anchoring group to form the organic dielectric thin layer 130. A top surface of the organic dielectric thin layer 130 is charged due to the cationic or anionic second end that is exposed on the top surface of the organic dielectric thin layer 130, thereby resulting in a selective bond with the functional molecular active layer 140 in a subsequent process.

Figure 3D:
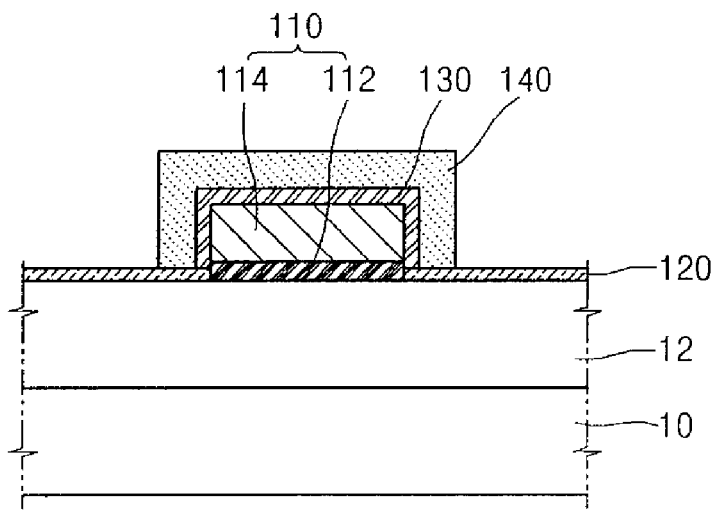

Referring to FIG. 3D, the functional molecular active layer 140 is formed on the organic dielectric thin layer 130.

The functional molecular active layer 140 is stacked on the organic dielectric thin layer 130 by selective self-assembly with positive and negative ions. The functional molecular active layer 140 includes an electroactive functional group having a cyclic compound.

Figure 3E:
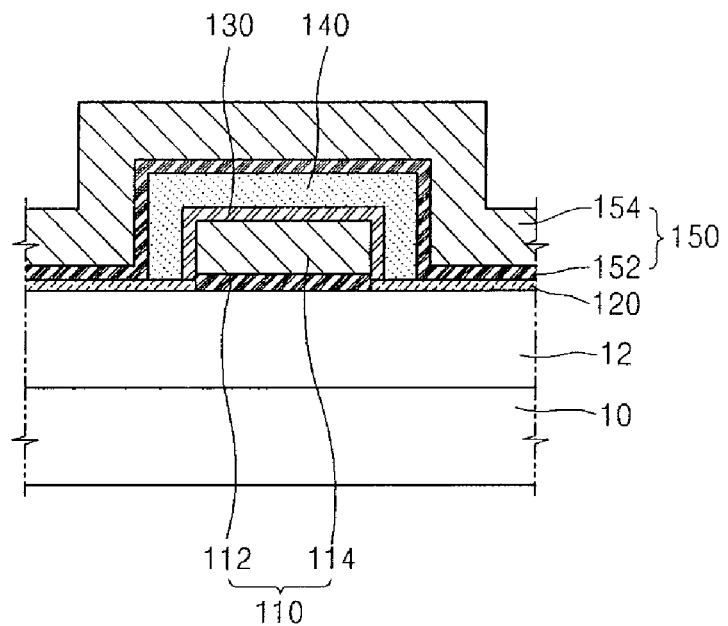

Referring to FIG. 3E, the second electrode 150 is formed on the functional molecular active layer 140.

The second electrode 150 may be formed by depositing materials for forming the second barrier layer 152 and the second metal layer 154 on a resultant structure including the functional molecular active layer 140 and patterning a resultant structure including the deposited materials for the second barrier layer 152 and second metal layer 154 into a desired shape, for example, a shape as illustrated in FIG. 1A. Once the second electrode 150 is formed, portions of the functional molecular active layer 140 and the organic dielectric thin layer 130 which are exposed between the plurality of second electrodes 150 may be removed, thereby completing the manufacture of the molecular electronic device 100.

Examples of the molecular electronic device 100 manufactured using the method of FIGS. 3A through 3E will now be explained.

EXAMPLE 1

Manufacture of Molecular Electronic Device

Example 1-1

Formation of First Electrode

A silicon oxide layer was formed on a silicon substrate, a Ti layer with a thickness of about 5 nm and an Au layer with a thickness of about 30 nm were sequentially stacked on the silicon oxide layer, and a resultant structure including the Ti layer and the Au layer was patterned to form a plurality of first electrodes which were arranged in an array pattern as illustrated in FIG. 1A. Each of the plurality of first electrodes had a line width of 50 nm, and a space between the plurality of first electrodes was 150 nm. In order to form the first electrodes, a PMMA resist layer was spin-coated on the silicon oxide layer and imprinted into a desired mask pattern by using a stamp, Ti and Au were sequentially deposited by E-beam deposition, and the mask pattern was removed.

Example 1-2

Formation of Hydrophobic Thin Layer

In order to change a hydrophilic surface of the silicon oxide layer to a hydrophobic layer, a resultant structure including the first electrode was dipped in a bicyclohexane solution, in which 2 mM of n-octadecyltrichlorosilane (OTS) was dissolved, for approximately 30 minutes. A resultant structure was washed with anhydrous chloroform three times, and was dried with a nitrogen gun to selectively form the hydrophobic thin layer including an OTS molecular layer only on the surface of the silicon oxide layer. The hydrophobic thin layer had a water contact angle of approximately 104° and was hydrophobic. Also, it was found that there was no change in the water contact angle on the surface of the first electrode before and after the hydrophobic thin layer was formed. Accordingly, an OTS molecular layer was not formed on the surface of the first electrode.

Example 1-3

Formation of Organic Dielectric Thin Layer (I)

In order to form an organic dielectric thin layer, particularly having cationic surface characteristics, on the surface of the first electrode formed in Example 1-1, 6-ammonium-1-hexanethiol was used. In order to form the organic dielectric thin layer as a single molecular layer, the 6-ammonium-1-hexanethiol and 5% (v/v)-$N(CH_2CH_3)_3$ were dissolved in ethanol. At this time, a concentration thereof was maintained at 4 mM. The substrate on which the first electrode and the hydrophobic thin layer were formed was dipped in the prepared solution for 12 hours, was washed sequentially with ethanol, 20% $CH_3COOH$/ethanol, and ethanol, and was dried with a nitrogen gun. The organic dielectric thin layer was not formed on a surface of the hydrophobic thin layer formed in Example 1-2.

Example 1-4

Formation of Organic Dielectric Thin Layer (II)

In order to form an organic dielectric thin layer, particularly having anionic surface characteristics, on the surface of the first electrode formed in Example 1-1, 11-mercapto-undecanoic acid and 5% $CF_3COOH$ were dissolved in ethanol. At this time, a concentration thereof was maintained at 4 mM. The substrate on which the first electrode and the hydrophobic thin layer were formed was dipped in the prepared solution for 12 hours, was washed sequentially with ethanol, 20% (v/v)$NH_4OH$/ethanol, and ethanol, and was dried with a nitrogen gun. The organic dielectric thin layer was not formed on a surface of the hydrophobic layer formed in Example 1-2.

Example 1-5

Formation of Functional Molecular Active Layer (I)

In order to form a first molecular active layer on the organic dielectric thin layer having the cationic surface characteristics formed in Example 1-3, PEDOT:PSS including negative ions was self-assembled on the organic dielectric thin layer. In detail, a resultant structure including the organic dielectric thin layer having the cationic surface characteristics formed in Example 1-3 was dipped in 10 ml of PEDOT:PSS (Baytron P, Bayer Corp.) solution, which was dissolved in 10 ml of distilled water, for approximately 10 minutes, and was washed with distilled water three times respectively for 3, 1, and 1 minutes. A new washing solution was used for each washing.

Next, in order to form a cationic second molecular active layer on the first molecular active layer, a resultant structure including the first molecular active layer was dipped in 0.5 mM of amino methanofullerene solution, which was dissolved in a solvent in which distilled water and dimethyl sulfoxide (DMSO) were mixed at a ratio of 1:1, for 10 minutes, and was washed with distilled water three times respectively for 3, 1, and 1 minutes to form the cationic second molecular active layer on the first molecular active layer. A new washing solution was used for each washing.

A functional molecular active layer having a multi-layer structure was formed by alternately forming a total of 40 anionic first molecular active layers and cationic second molecular active layers on a resultant structure including the second molecular active layer in the same manner as that used to form the first molecular active layer and the second molecular active layer. The formed functional molecular active layer had a total thickness of approximately 40 nm.

Example 1-6

Formation of Functional Molecular Active Layer (II)

A functional molecular active layer having a multi-layer structure was formed by forming a cationic second molecular active layer on the organic dielectric thin layer having the anionic surface characteristics formed in Example 1-4, forming an anionic first molecular active layer on the second molecular active layer, and alternately forming a total of 40 cationic second molecular active layers and anionic first molecular active layers on the organic dielectric thin layer in the same manner as described in Example 1-5. The formed functional molecular active layer had a total thickness of approximately 40 nm.

Example 1-7

Formation of Second Electrode

In a similar manner to that used to form the first electrodes of Example 1-1, a plurality of second electrodes arranged in an array pattern as shown in FIG. 1A were formed on respective resultant structures including the functional molecular active layers formed in Example 1-5 and Example 1-6. Each of the second electrodes was formed by sequentially stacking a Ti layer with a thickness of 5 nm and an Au layer with a thickness of 65 nm.

Once the plurality of second electrodes were formed, portions of the functional molecular active layer and the organic dielectric thin layer which were exposed between the second electrodes were removed by reactive ion etching (RIE).

EXAMPLE 2

Measurement of Thickness of Functional Molecular Active Layer

Table 1 shows a water contact angle and a layer thickness according to the number of single molecular layers constituting the functional molecular active layer formed in Example 1-5. Here, the layer thickness was measured by an ellipsometer.

In Example 2, as the number of single molecular layers constituting the functional molecular active layer increases, the layer thickness increases linearly.

EXAMPLE 3

Evaluation of Electric Reliability of Molecular Electronic Device According to Number of Single Molecular Layers Constituting Functional Molecular Active Layer Table 2 shows the occurrence of short circuits in each of molecular electronic devices according to the number of single molecular layers constituting the functional molecular active layer formed in Example 1-5.

TABLE 2

| Number of single molecular layers | Number of evaluated devices | Number of devices without short circuit | Number of devices with short circuit | Yield (%) |
|---|---|---|---|---|
| 10 | 20 | 10 | 10 | 50 |
| 20 | 20 | 15 | 5 | 75 |
| 30 | 20 | 18 | 2 | 90 |
| 40 | 20 | 20 | 0 | 100 |

In Table 2, "yield" refers to a ratio of the number of devices with no short-circuit to the number of evaluated devices.

Referring to Table 2, as the number of single molecular layers constituting the functional molecular active layers increases and accordingly the thickness of the functional molecular active layer increases, the occurrence of short circuits decreases and hysteresis increases.

That is, considering short circuit-free yield and hysteresis characteristics, the thickness of the functional molecular active layer, and cross-talk caused between two adjacent electrode lines among a plurality of electrode lines, the optimal thickness of the functional molecular electronic device manufactured in Example 1 to obtain desired characteristics of the molecular electronic device is approximately 40 nm.

The above evaluation results are experimental results obtained for resultant devices that were exemplarily formed using specific materials in predetermined dimensions. Thus, the evaluation results obtained in Example 3 are not applied to all molecular electronic devices according to the present invention. That is, optimal conditions for manufacturing molecular electronic devices according to the present invention may vary depending on materials and dimensions of elements constituting the molecular electronic devices according to the present invention, and other process parameters. Also, it should be understood that the dimensions and materials of the elements constituting the molecular electronic devices may vary within the scope of the present invention.

EXAMPLE 4

Evaluation of Switching Characteristics and Memory Characteristics of Molecular Electronic Device The following experiments were performed in order to evaluate the switching characteristics and the memory characteristics of the molecular electronic device manufactured in Example 1.

TABLE 1

| | Number of layers | | | | | | | | | |
|---|---|---|---|---|---|---|---|---|---|---|
| | 1 | 2 | 3 | 4 | 5 | 6 | ... | 38 | 39 | 40 |
| Water contact angle | 78 | 41 | 62 | 41 | 64 | 43 | ... | 43 | 65 | 45 |
| Thickness (nm) | 2.8 | 3.4 | 4.2 | 5.0 | 5.8 | 6.8 | ... | 39 | 39.8 | 41.2 |

Measurements for evaluation were performed in a vacuum chamber in which room temperature was maintained in order to prevent degradation (e.g., oxidation) of molecules. Current-voltage characteristics were measured by using a semiconductor parameter analyzer (HP 4156C capable of measuring current and voltage in a range of 1 fA/2V to 1 A/100V). The switching characteristics and memory characteristics of the molecular electronic device were analyzed in two directions. That is, the switching characteristics and memory characteristics were evaluated from results measured from a (+) voltage to a (−) voltage and from a (−) voltage to a (+) voltage. Also, for a voltage loop, the switching characteristics were evaluated in a direction of 0→a (+) voltage→a (−) voltage→a (+) voltage.

Figure 4:
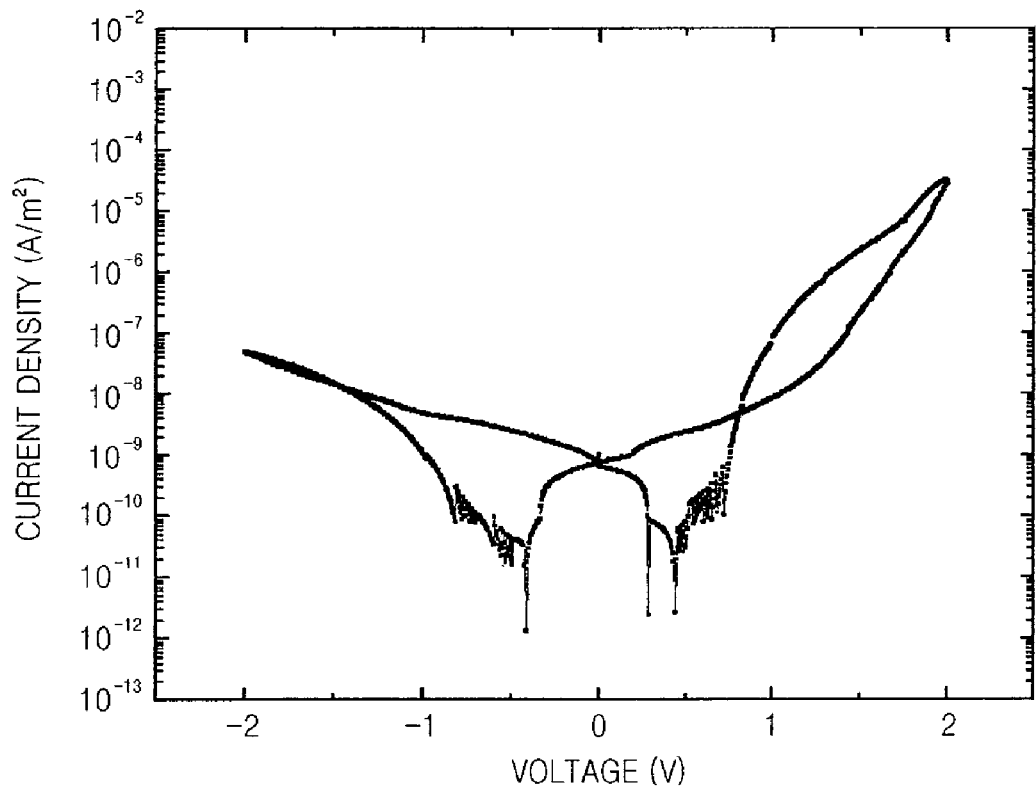
FIG. 4 is a hysteresis graph illustrating the switching characteristics of a molecular electronic device according to an embodiment of the present invention.

FIG. 4 is a hysteresis graph illustrating the switching characteristics of the molecular electronic device manufactured in Example 1.

Pulse measurement for the evaluation of the memory characteristics was performed by using a measurement/pulse selector unit (SMU-PGU selector, HP 16440A) and a pulse generator unit (HP 41501 expander) which could be connected to the semiconductor parameter analyzer.

Figure 5:
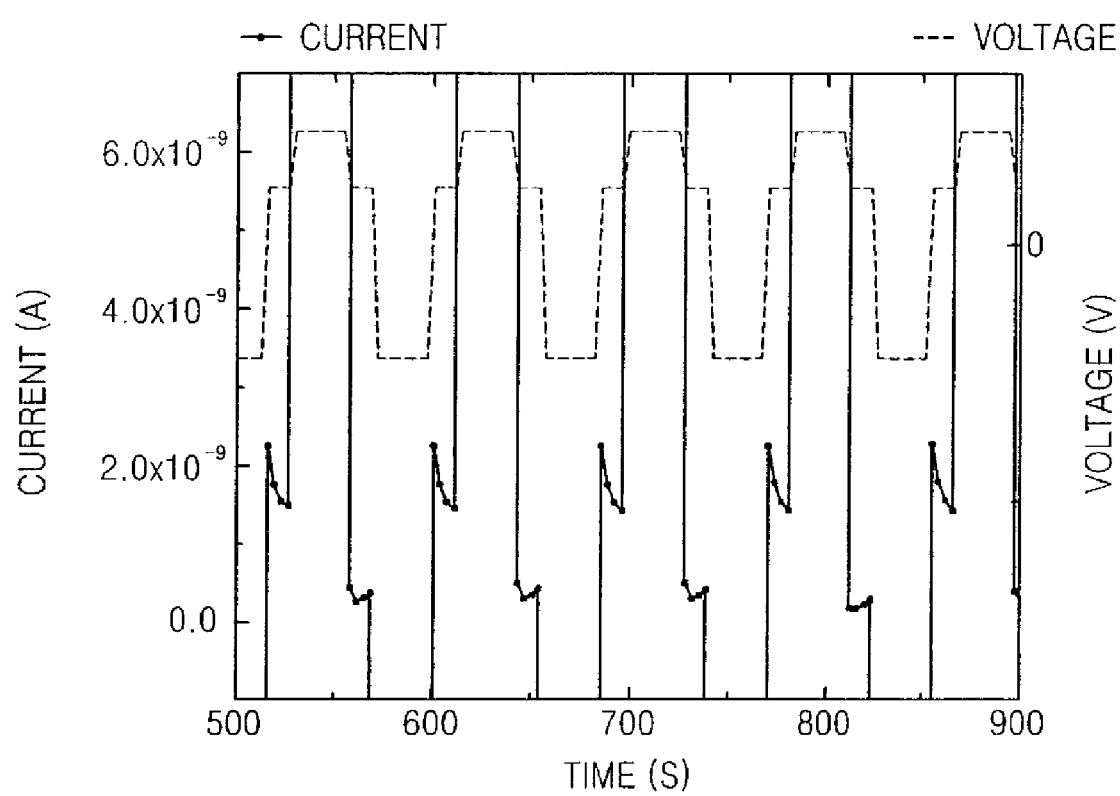
FIG. 5 is a graph illustrating the memory characteristics of the molecular electronic device according to an embodiment of the present invention.

FIG. 5 is a graph illustrating the memory characteristics of the molecular electronic device manufactured in Example 1.

In order to measure the memory characteristics, the pulse generator unit was set to generate pulses with frequencies ranging from several Hz to several MHz considering the switching characteristics of the molecular electronic device. The rising/falling time of voltage pulses was set to 100 ns or less.

Hitherto, the molecular electronic device and the method of manufacturing the molecular electronic device according to the present invention have been specifically described. However, the above descriptions are intended to assist the understanding of the invention, and thus the above-described embodiments can be variously modified by those of ordinary skill in the art. Accordingly, the technical scope of the present invention for which protection is sought should be defined by the following claims.

The molecular electronic device according to the present invention includes a functional molecular active layer having a multi-layer structure in which a plurality of single molecular layers which are oppositely charged are alternately stacked on an organic dielectric thin layer by selective self-assembly with positive and negative ions. Since various single molecular layers having different structures may be used to form the functional molecular active layer having the multi-layer structure, molecular layers having structures capable of providing desired functions can be used if necessary. Also, since the functional molecular active layer has a multi-layer structure, the thickness of the functional molecular active layer can be easily increased. Accordingly, short circuits between a first electrode and a second electrode that is formed over the first electrode can be effectively prevented and the yield of the molecular electronic device can be improved.

Furthermore, the thickness of the functional molecular active layer can be freely adjusted by adjusting the number of single molecular layers included in the multi-layer structure of the functional molecular active layer. Accordingly, the thickness of the functional molecular active layer can be several nanometers which is about the thickness of a single molecular layer. Since the thickness of the functional molecular active layer can be adjusted to be several nanometers, a desired thickness can be easily obtained for the molecular electronic device, and charging effect can be adjusted according to a voltage applied between the first electrode and the second electrode.

The molecular electronic device can be used as a reliable switching device or memory device, and the potential practical use thereof as a switching device or a memory device can be increased.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of manufacturing a molecular electronic device, the method comprising:
   forming a first electrode on a first region of a top surface of an insulating layer that is formed on a substrate;
   forming a hydrophobic thin layer on a second region of the top surface which is not covered by the first electrode;
   forming an organic dielectric thin layer on a surface of the first electrode by contacting molecules each having a first end with an anchoring group and a second end with a cationic or anionic group with the surface of the first electrode;
   forming on the organic dielectric thin layer a functional molecular active layer that is stacked with positive and negative ions by using a selective self-assembly process and which comprises an electroactive functional group having a cyclic compound; and
   forming a second electrode on the functional molecular active layer.

2. The method of claim 1, wherein the forming of the hydrophobic thin layer comprises forming a molecular layer formed of alkyltrichlorosilane on the second region of the top surface of the insulating layer.

3. The method of claim 1, wherein the forming of the organic dielectric thin layer comprises forming the organic dielectric thin layer by self-assembling the molecules on the first electrode by using a thiol derivative or a silane derivative bonded to the first end of each of the molecules as an anchoring group.

4. The method of claim 1, wherein the forming of the functional molecular active layer comprises:
   (a) forming a first molecular active layer having a first charge, which is opposite to a charge of a surface of the organic dielectric thin layer, on the surface of the organic dielectric thin layer by selective self-assembly with positive and negative ions; and
   (b) forming a second molecular active layer having a second charge, which is opposite to the first charge, on a surface of the first molecular active layer by selective self-assembly with positive and negative ions.

5. The method of claim 4, further comprising (c) forming a first molecular active layer having the first charge on a surface of the second molecular active layer by selective self-assembly with positive and negative ions, after operation (b).

6. The method of claim 5, further comprising repeatedly performing operation (b) and operation (c) several times, after operation (c).

7. A molecular electronic device comprising:
   a first electrode;
   an organic dielectric thin layer comprising molecules each having a first end self-assembled on a surface of the first electrode and a second end having a cationic or anionic group;

a functional molecular active layer stacked on the organic dielectric thin layer by selective self-assembly with positive and negative ions and comprising an electroactive functional group having a cyclic compound; and a second electrode formed on the functional molecular active layer, wherein each of the first electrode and the second electrode is formed on an insulating layer, the molecular electronic device further comprising a hydrophobic thin layer formed between the insulating layer and the second electrode.

8. The molecular electronic device of claim 7, wherein the organic dielectric thin layer is a molecular layer formed by selectively binding a compound comprising a thiol derivative or a silane derivative as an anchoring group onto the surface of the first electrode by self-assembly.

9. The molecular electronic device of claim 8, wherein the organic dielectric thin layer is a single molecular layer.

10. The molecular electronic device of claim 7, wherein the organic dielectric thin layer comprises molecules having a structure selected from the group of structures represented by

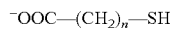 <Formula 1> where n is an integer of 1 to 20, and

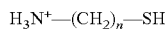 <Formula 2> where n is an integer of 1 to 20.

11. The molecular electronic device of claim 7, wherein the functional molecular active layer comprises a first molecular active layer and a second molecular active layer, wherein the first molecular active layer and the second molecular active layer are oppositely charged to each other.

12. The molecular electronic device of claim 7, wherein the functional molecular active layer comprises:

a first molecular active layer having a first charge opposite to a charge of the second end of each of the molecules of the organic dielectric thin layer and stacked on the second end of each of the molecules of the organic dielectric thin layer by selective self-assembly with positive and negative ions; and a second molecular active layer having a second charge opposite to the first charge of the first molecular active layer and stacked on the first molecular active layer by selective self-assembly with positive and negative ions.

13. The molecular electronic device of claim 12, wherein the second end of each of the molecules of the organic dielectric thin layer has a cationic group, the first molecular active layer comprises an anionic molecule, and the second molecular active layer comprises a cationic molecule.

14. The molecular electronic device of claim 12, wherein the second end of each of the molecules of the organic dielectric thin layer has an anionic group, the first molecular active layer comprises a cationic molecule, and the second molecular active layer comprises an anionic molecule.

15. The molecular electronic device of claim 7, wherein the functional molecular active layer has a multi-layer structure in which a plurality of first molecular active layers each having a first charge and a plurality of second molecular active layers each having a second charge that is opposite to the first charge are alternately stacked.

16. The molecular electronic device of claim 15, wherein each of the plurality of first molecular active layers comprises a cationic molecule and each of the plurality of second molecular active layers comprises an anionic molecule.

17. The molecular electronic device of claim 15, wherein each of the plurality of first molecular active layers comprises an anionic molecule and each of the plurality of second molecular active layers comprises a cationic molecule.

18. The molecular electronic device of claim 15, wherein each of the plurality of first molecular active layers and the plurality of second molecular active layers comprises a material selected from the group consisting of poly(3,4-ethylenedioxythiophene doped with poly(4-styrenesulonate) (PEDOT/PSS), Rose Bengal, metal-terpyridine complex, metal-bipyridine complex, porphyrin, ferrocene, and amino methanofullerene.

19. The molecular electronic device of claim 7, wherein the hydrophobic thin layer is a single molecular layer self-assembled on a surface of the insulating layer.

20. The molecular electronic device of claim 19, wherein the hydrophobic thin layer comprises alkyltrichlorosilane.

21. The molecular electronic device of claim 7, wherein the first electrode is a single layer comprising a single metal, or a multi-layer structure comprising at least two different metals.

22. The molecular electronic device of claim 7, wherein the second electrode is a single layer comprising a single metal, or a multi-layer structure comprising at least two different metals.

\* \* \* \* \*